(12) United States Patent
Chidambarrao et al.

(10) Patent No.: US 8,299,622 B2
(45) Date of Patent: Oct. 30, 2012

(54) IC HAVING VIABAR INTERCONNECTION AND RELATED METHOD

(75) Inventors: Dureseti Chidambarrao, Weston, CT (US); Stephen E. Greco, LaGrangeville, NY (US); Kia S. Low, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 574 days.

(21) Appl. No.: 12/186,061

(22) Filed: Aug. 5, 2008

(65) Prior Publication Data

US 2010/0032846 A1    Feb. 11, 2010

(51) Int. Cl.
 *H01L 23/52* (2006.01)
(52) U.S. Cl. . 257/774; 257/775; 257/758; 257/E23.011; 257/E23.145
(58) Field of Classification Search .......... 257/758, 257/773–776, E23.011, E23.145
See application file for complete search history.

(56) References Cited

U.S. PATENT DOCUMENTS

| | | | |
|---|---|---|---|
| 5,451,551 A | 9/1995 | Krishnan et al. | |
| 5,798,937 A | 8/1998 | Bracha et al. | |
| 6,306,769 B1 | 10/2001 | Subramanian et al. | |
| 6,316,836 B1 * | 11/2001 | Mayuzumi | 257/775 |
| 6,352,917 B1 | 3/2002 | Gupta et al. | |
| 6,555,467 B2 | 4/2003 | Hsu et al. | |
| 6,600,225 B2 * | 7/2003 | Tanaka | 257/750 |
| 6,784,091 B1 | 8/2004 | Nuetzel et al. | |
| 6,888,251 B2 | 5/2005 | Cooney et al. | |
| 7,071,097 B2 | 7/2006 | Colburn | |
| 2002/0098673 A1 | 7/2002 | Yeh et al. | |
| 2003/0008493 A1 | 1/2003 | Lee | |
| 2005/0227481 A1 | 10/2005 | Brase et al. | |
| 2005/0233519 A1 | 10/2005 | Chang et al. | |
| 2006/0012052 A1 | 1/2006 | McDevitt et al. | |
| 2006/0064653 A1 | 3/2006 | Zhang et al. | |
| 2007/0044061 A1 * | 2/2007 | Nakamoto | 716/13 |
| 2008/0197494 A1 * | 8/2008 | Matsubara | 257/741 |

FOREIGN PATENT DOCUMENTS

JP   2004228569 A   1/2004
WO   02103971 A2   12/2002

OTHER PUBLICATIONS

U.S. Appl. No. 10/908,623, filed May 19, 2005, Notice of Allowance and Fees Due dated Feb. 21, 2006.
International Search Report dated Sep. 1, 2009.

* cited by examiner

*Primary Examiner* — Matthew E Warren
(74) *Attorney, Agent, or Firm* — Katherine S. Brown; Hoffman Warnick LLC

(57) ABSTRACT

An IC including first metal layer having wiring running in a first direction; a second metal layer having wiring running in a second direction perpendicular to the first direction; and a first via layer between the first metal layer and the second metal layer, the first via layer including a viabar interconnecting the first metal layer to the second metal layer at a first location where the first metal layer vertically coincides with the second metal layer and, at a second location, connecting to wiring of the first metal layer but not wiring of the second metal layer.

17 Claims, 7 Drawing Sheets

IC HAVING VIABAR INTERCONNECTION AND RELATED METHOD

BACKGROUND

1. Technical Field

The disclosure relates generally to integrated circuit fabrication, and more particularly, to use of a viabar for interconnecting metal layers.

2. Background Art

In integrated circuit (IC) chips, vias connect different metal layers together. In order to ensure proper functioning, vias are duplicated or made redundant. Wiring in metal layers runs in parallel directions within a layer, but perpendicular directions in adjacent metal layers. A via is made where wiring of one metal layer coincides with wiring of an adjacent metal layer. One mechanism to provide a redundant via is to provide a small portion of wiring in one metal layer that runs in a direction perpendicular to the rest of the wiring in that metal layer. This small portion is referred to as a wrong way metal or a hook. The wrong way metal is then connected using a redundant via to wiring in the adjacent metal layer.

BRIEF SUMMARY

A first aspect of the disclosure provides an integrated circuit (IC) comprising: a first metal layer having wiring running in a first direction; a second metal layer having wiring running in a second direction perpendicular to the first direction; and a first via layer between the first metal layer and the second metal layer, the first via layer including a viabar interconnecting the first metal layer to the second metal layer at a first location where the first metal layer vertically coincides with the second metal layer and, at a second location, connecting to wiring of the first metal layer but not wiring of the second metal layer.

A second aspect of the disclosure provides a method comprising: providing a first metal layer having wiring running in a first direction; providing a second metal layer having wiring running in a second direction perpendicular to the first direction; evaluating which of the following structures presents a lowest possibility of degrading yield: a) use of a wrong way metal extending in a direction perpendicular to the second direction within the second metal layer and a pair of vias interconnecting the wrong way metal to wiring in the first metal layer, or b) a viabar, in a first via layer between the first metal layer and the second metal layer, and interconnecting the first metal layer to the second metal layer at a first location where the first metal layer vertically coincides with the second metal layer and, at a second location, interconnecting to wiring of the first metal layer but not wiring of the second metal layer; and implementing the structure that presents a lowest possibility of degrading yield.

A third aspect of the disclosure provides an integrated circuit (IC) comprising: a first metal layer having wiring running in a first direction; a second metal layer having wiring running in a second direction perpendicular to the first direction; a wrong way metal extending in a direction perpendicular to the second direction within the second metal layer and a pair of vias interconnecting the wrong way metal to wiring in the first metal layer; and a first via layer between the first metal layer and the second metal layer, the first via layer including: a viabar interconnecting the first metal layer to the second metal layer at a first location where the first metal layer vertically coincides with the second metal layer and, at a second location, connecting to wiring of the first metal layer but not wiring of the second metal layer, wherein the viabar has a width that is substantially identical to a width of another via in the via layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
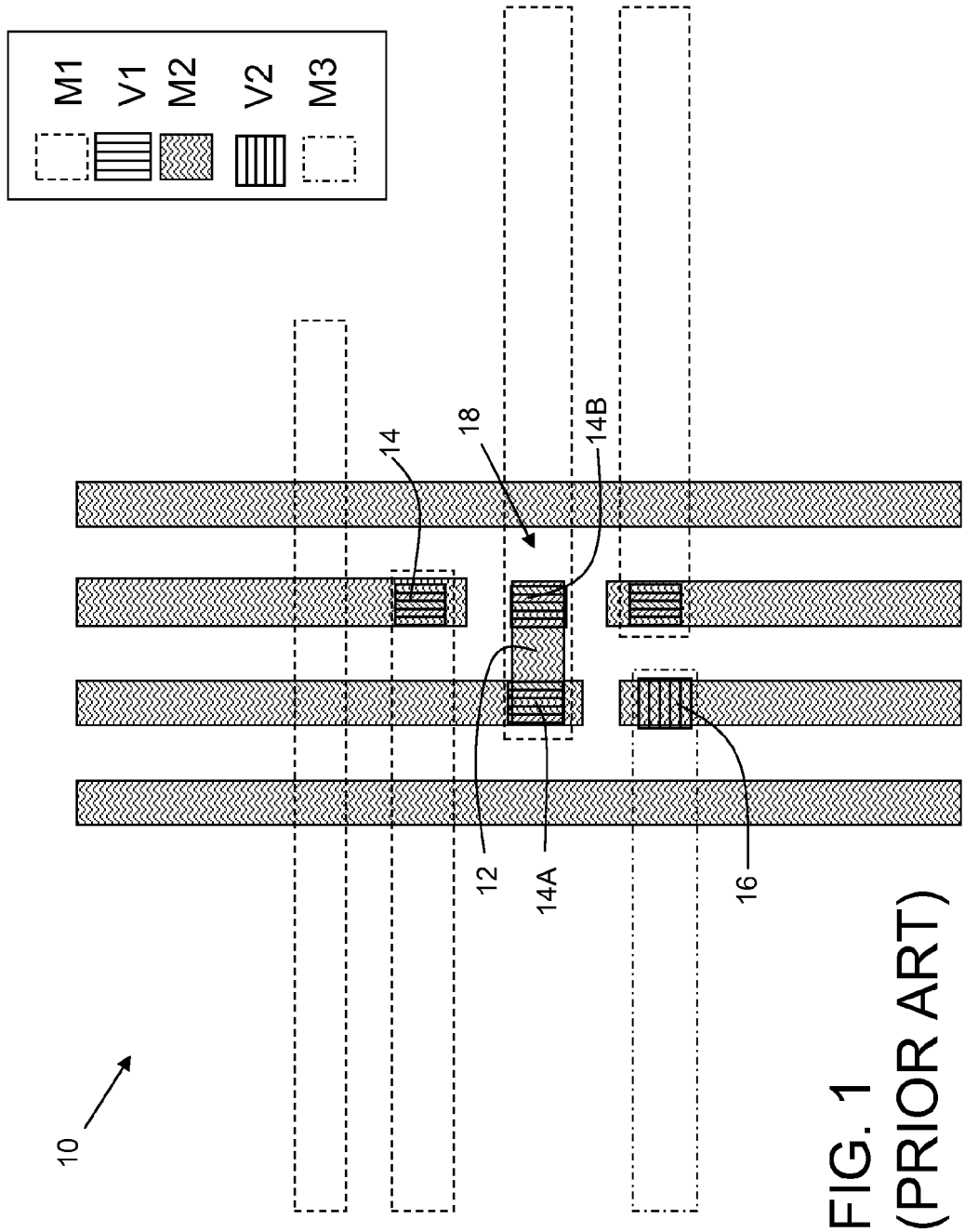
FIG. 1 shows a conventional IC having a wrong way metal.

Referring to the drawings, each of FIGS. 1-3B and 5 show three metal layers M1, M2 (and perhaps a third metal layer M3) and intervening via layer V1 (and perhaps via layer V2) according to the legend provided. As shown, M1 is a first metal layer, V1 is via layer above first metal layer M1, M2 is a second metal layer above via layer V1, V2 is a via layer above second metal layer M2, and M3 is a third metal layer above second metal layer M2. M1 and M3, if they are minimum dimension lines, are usually drawn at the same width as the square vias, but the drawings show them with a slightly oversized width for clarity. In any case, the width of the lines is not essential to the invention—it could be used for minimum width lines or for wider lines. This layout is used throughout the specification to describe the disclosure. It is noted, however, that the first, second, and third denotations used in the specification may not correspond to those used in the claims, i.e., what is first and second in the claims may vary depending on the embodiment being referenced. In addition, metal layers M1, M2, M3 and via layers V1, V2 may be located anywhere within the levels of an IC. Hence, their denotation as first, second, etc., is not intended to denote a position within an IC.

As shown, adjacent metal layers, e.g., M1 and M2, are seen to have wiring running primarily in directions perpendicular to each other, which is typical of semiconductor designs. Second metal layer M2 is seen to be fairly uniform because all of the M2 lines have the same width and spacing, and all run in the same direction. A pattern with such uniformity in design is usually lithographically printable with a relatively large process window for critical dimension control because the pattern approximates a simple diffraction grating.

FIG. 1 shows a conventional IC 10 including a wrong way metal 12 in the form of a hook (it may also be other shapes such as a T-shape). FIG. 1 also shows vias 14 connecting first metal layer M1 and second metal layer M2, and via 16 interconnecting second metal layer M2 and third metal layer M3. It is desirable from a yield perspective to design with redundant vias where possible (in other words, to make critical connections between metal lines on adjacent levels with at least two vias), so that if one via fails to make good contact, its redundant partner via will ensure circuit functionality. In this example, a central via 14A is assumed to be making a critical connection, and redundancy (using via 14B) is therefore highly desired. Since wiring in first metal layer M1 to be contacted by via 14A runs in a direction perpendicular to second metal layer M2 wiring, a conventional way of making that connection redundant would be to add a "wrong way metal" 12 (i.e., a piece of metal with its long dimension in a direction perpendicular to the direction in which the majority of wiring runs, or in other words a piece of second metal layer M2 metal running in the same direction as first metal layer M1 metal to be contacted). The addition of wrong way metal 12 may create more minimum space 18 but, even if that space is not minimum and does not present a significant shorting danger, the addition of wrong way metal 12 distorts the uniformity of the second metal layer M2 pattern (distorts the simple diffraction grating) and in general reduces second metal layer M2 lithography process window in its local environment. If, for instance, the focus setting is off from the best nominal focus, dimensional control of the metal lines and spaces will be at greater risk, and there will in general be a greater chance of metal shorts or opens.

Referring to FIGS. 2-6, IC 100 according to the disclosure includes first metal layer M1 having wiring running in a first direction, and second metal layer M2 having wiring running in a second direction perpendicular to the first direction. First via layer V1 is between first metal layer M1 and second metal layer M2. In order to address the above-described situation, one embodiment of the disclosure provides IC 100 including a viabar 102 interconnecting first metal layer M1 to second metal layer M2 at a first location 104 where first metal layer M1 vertically coincides with second metal layer M2 and, at a second location 106, connects to wiring of one of metal layers M1, M2 but not wiring of the other metal layer M2, M1.

Figure 2:
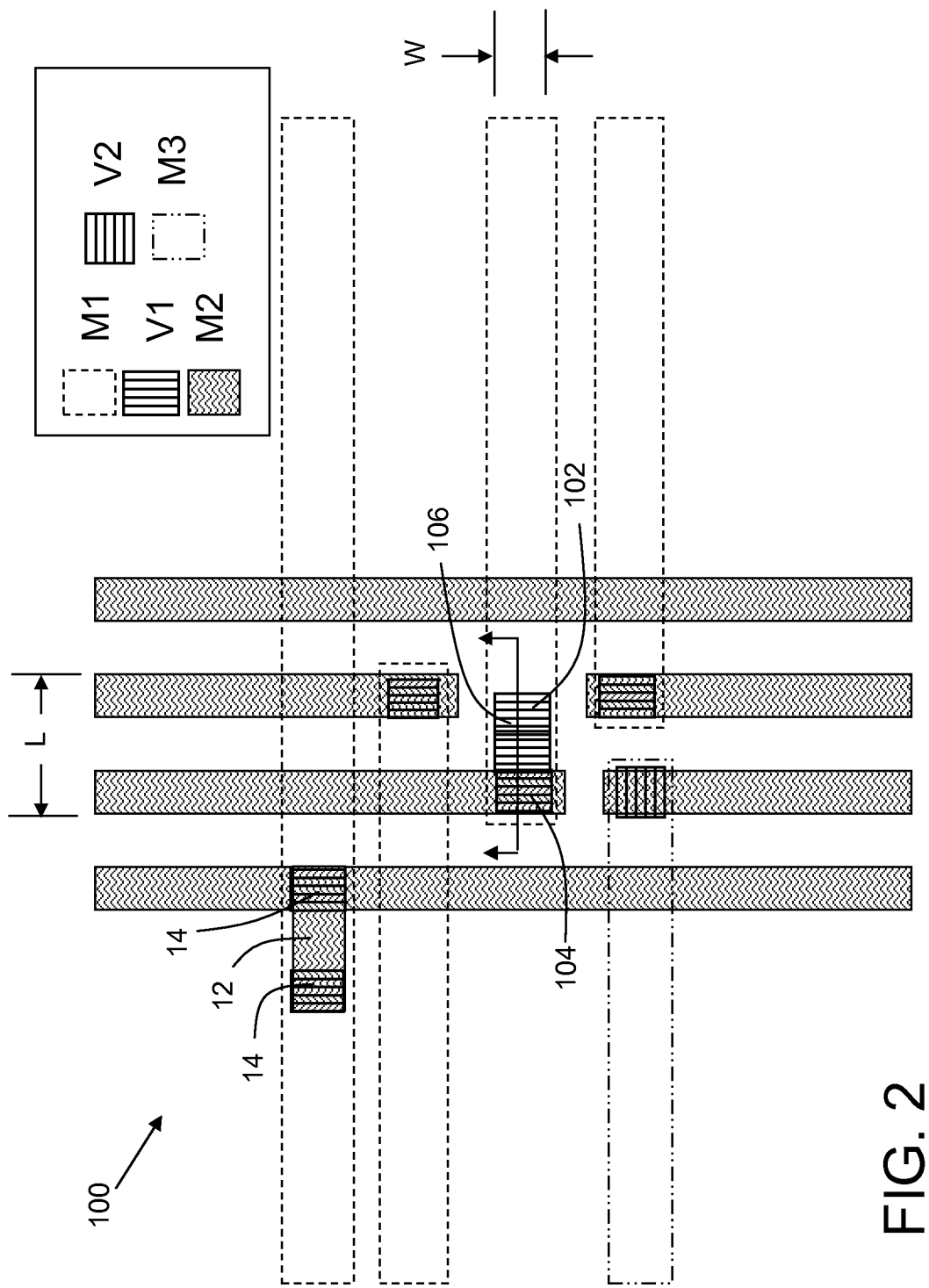
FIG. 2 shows a plan view of embodiments of an IC according to the disclosure.
Figure 3A:
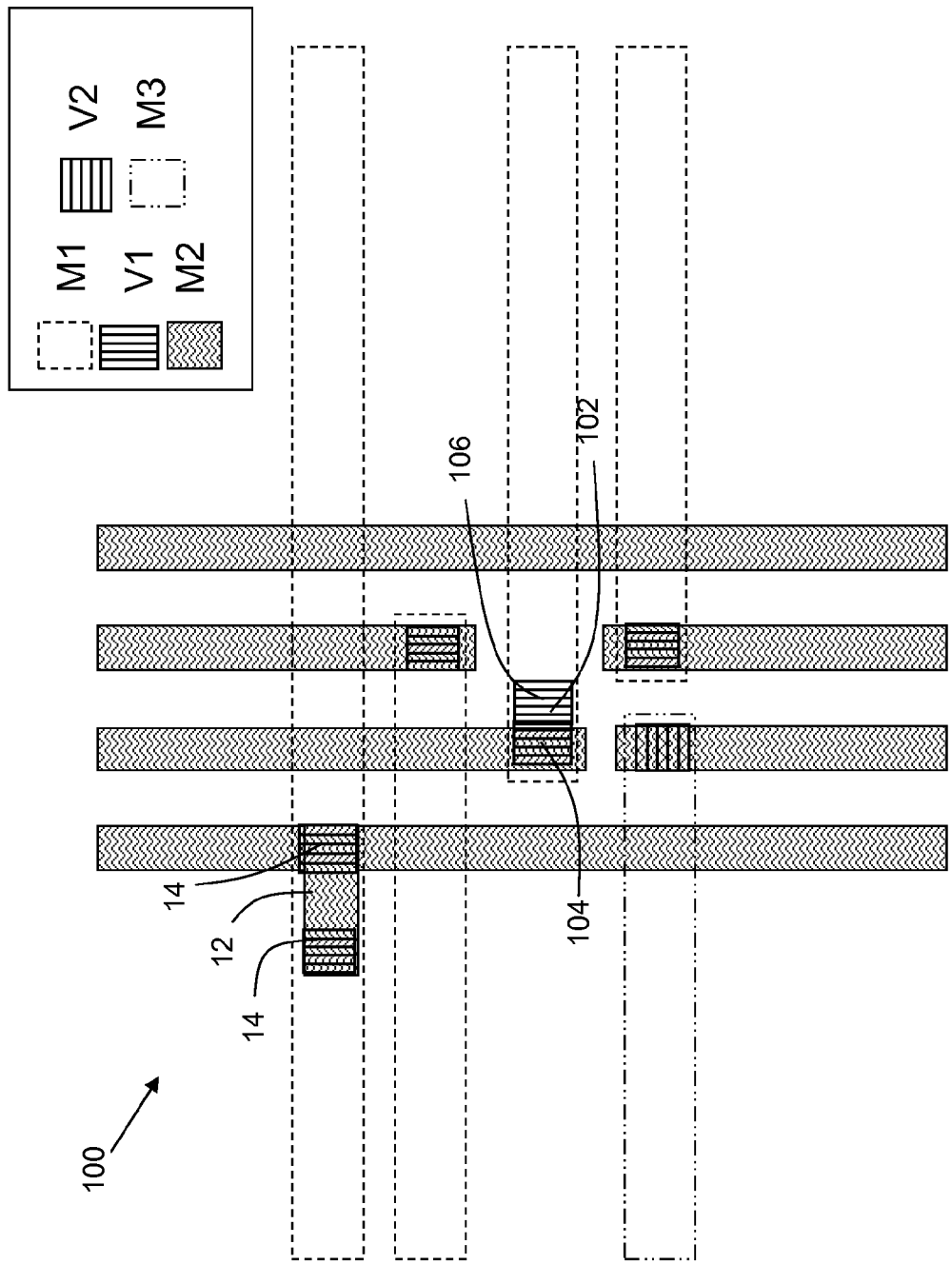
FIGS. 3A-B show plan views of other embodiments of the IC.
Figure 3B:
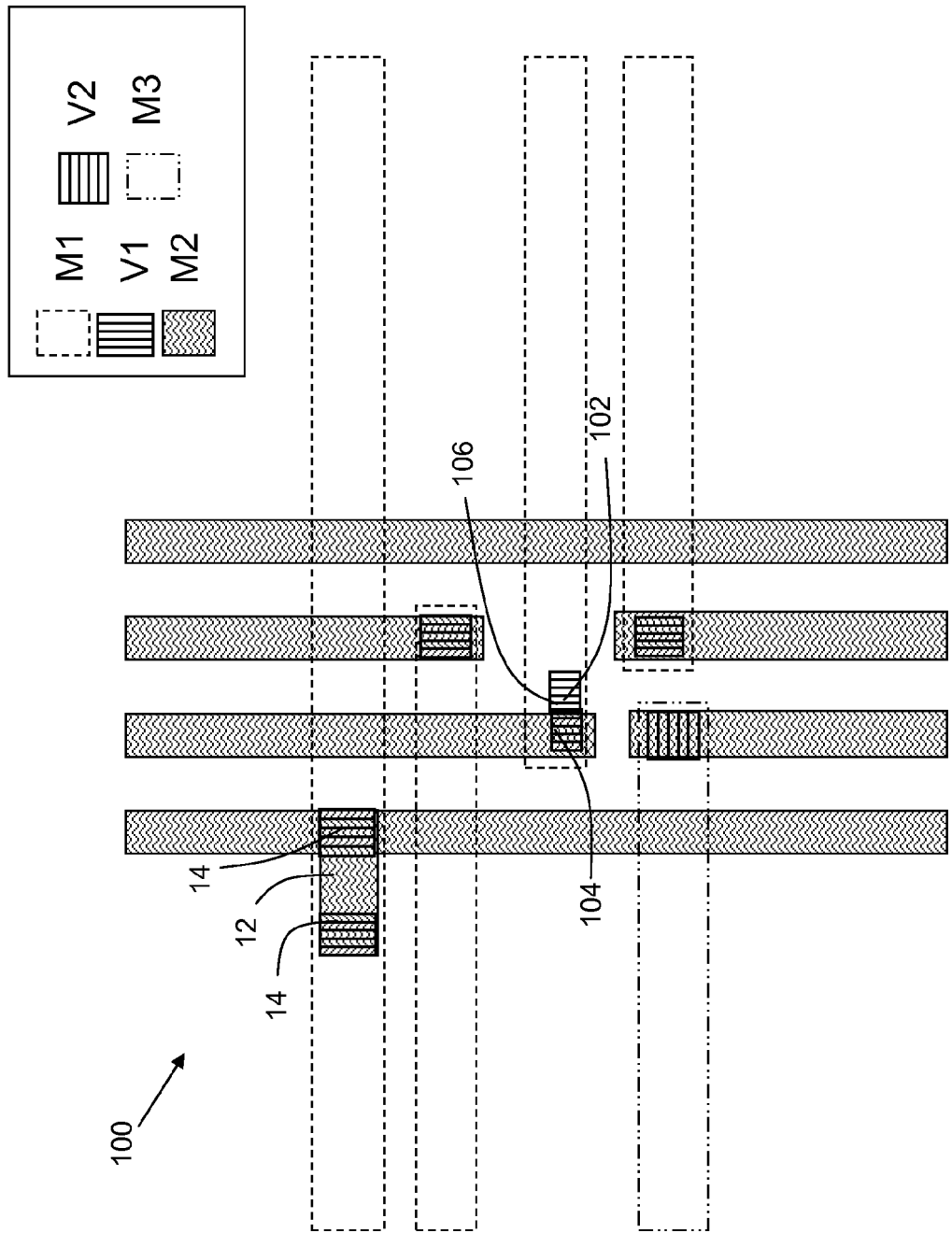
Figure 4:
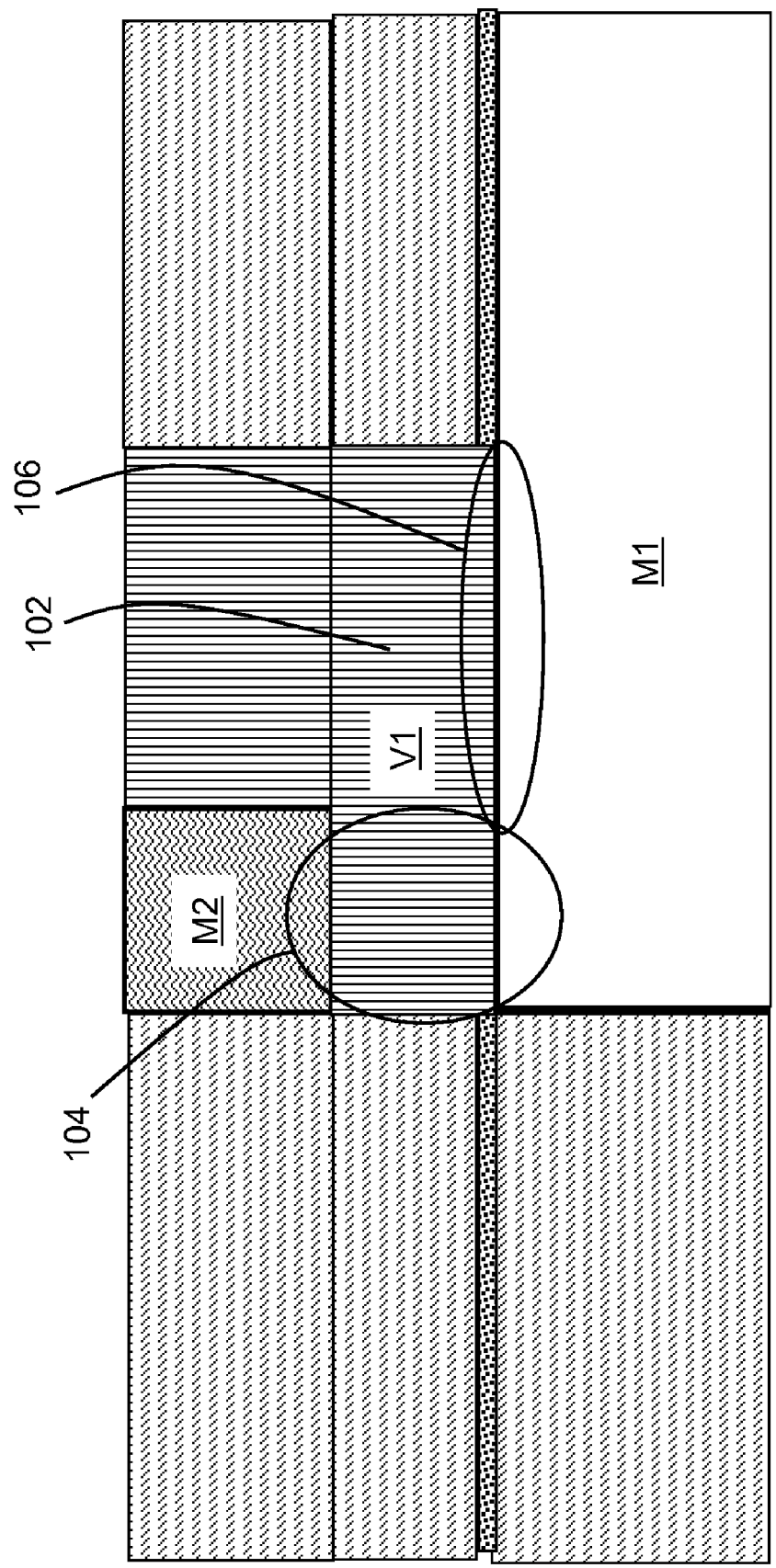
FIG. 4 shows a partial cross-sectional view of the IC along the view line shown in FIG. 2.

In FIGS. 2-4, the upper second metal layer M2 is the metal layer not connected to viabar 102 at a location 106. Consequently, the uniformity of the second metal layer M2 pattern is not disturbed by the addition of a wrong way metal 12 (FIG. 1). Because of the assumed "via first" integration process in which the via or viabar is etched first in dielectric 110 (FIGS. 4 and 6), and then the line above the via is etched in the dielectric, the top portion of the viabar essentially becomes indistinguishable from the M2 metal. Although viabar 102 is not "redundant" by virtue of the fact that there is one viabar making the connection as opposed to two, viabar 102 is larger in area than a single square via 14 with side dimension equal to width W of viabar 102, and is expected to provide a more robust connection than the single square via by virtue of the increased contact area to metal above and below. In addition, the structure may be easier to print and easier to fill reliably with metal.

Figure 5:
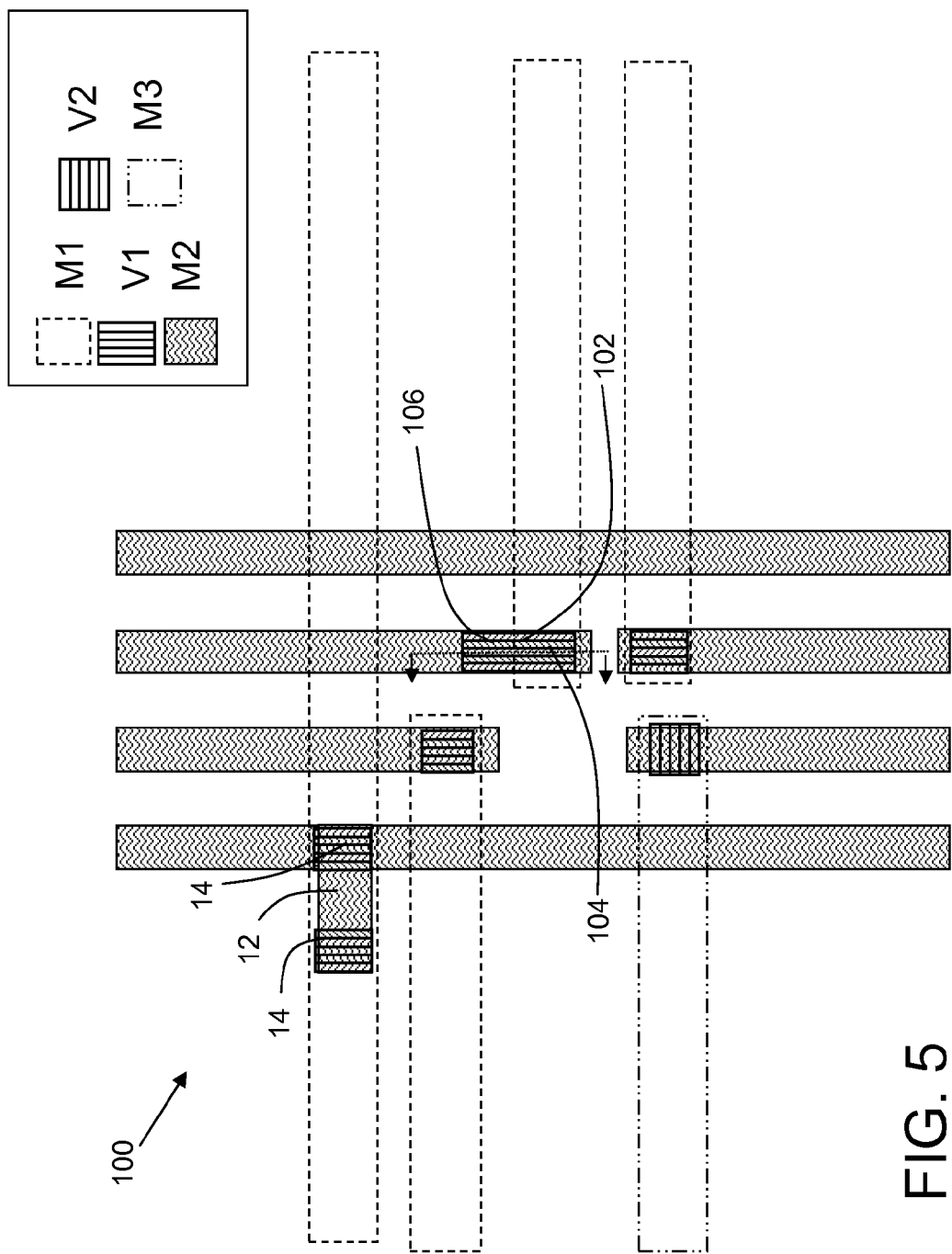
FIG. 5 shows a plan view of another embodiment of the IC according to the disclosure.
Figure 6:
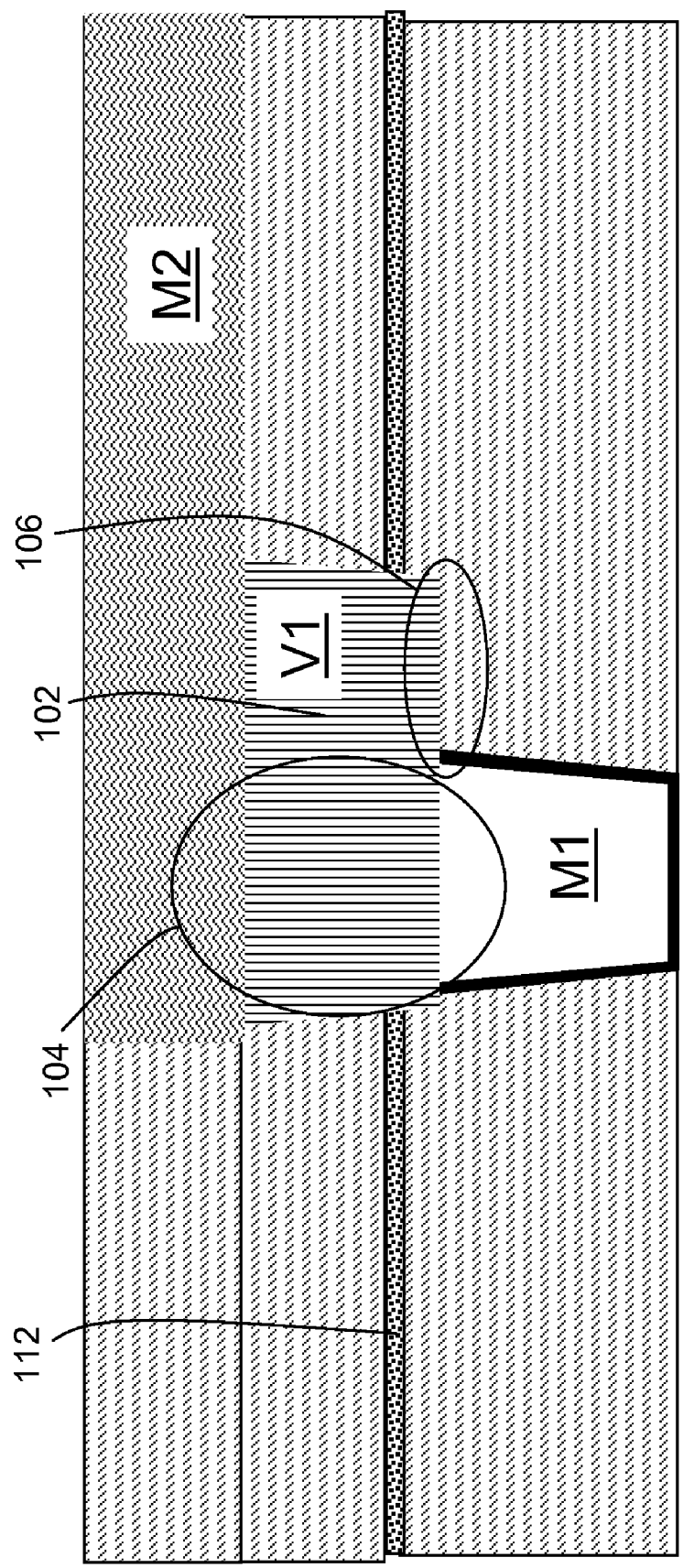
FIG. 6 shows a partial cross-sectional view of the IC along the view line shown in FIG. 5.

Referring to FIGS. 5-6, in another embodiment, the lower first metal layer M1 may be the metal layer not connected to viabar 102 at a location 106 where first and second metal layers M1 and M2 do not vertically coincide. That is, in the FIGS. 5-6 embodiment, viabar 102 is un-landed over a portion of first metal layer M1, meaning that a significant portion of viabar 102 does not have first metal layer M1 metal beneath it. FIG. 6 depicts the structure assuming that a conventional etch stop 112 (e.g., silicon carbide, silicon nitride, etc.) prevents viabar 102 from being etched significantly below the top of the underlying metal. In the case of a viabar 102 having a length L twice its width W, approximately 50% of the viabar area does not land on first metal layer M1 wiring, so the connection does not have the advantage of increased contact area, as 2 single vias would have, or as the viabar connection described in the first embodiment would have. However, the connection is more robust than a single via because: 1) the viabar is easier to fill with metal because of its increased aspect ratio, 2) the viabar results in a first via layer V1 to first metal layer M1 connection which has a built in tolerance to misalignment in one direction, 3) the liner (not shown) in the viabar will always contact the first metal layer M1 liner, which gives a stable and redundant current path (potentially important in case there is a void in the M1 copper beneath the viabar), and 4) the extra volume of copper in the bottom of the viabar will act as a reservoir to extend the via electromigration lifetime.

In one embodiment, as shown in FIGS. 2-3A, a width W of viabar 102 is substantially identical to a width of another (conventional) via 14 in via layer V1. However, viabar 102 may have a length that is any multiple greater than 1.0 than its width. As shown in FIG. 2, viabar 102 may have a length L approximately three times width W thereof, and in another embodiment, shown in FIG. 3A, viabar 102 may have a length L approximately twice width W thereof. In the latter case, viabar 102 would provide the same via contact area as two square vias, while leaving a larger space from the end of the viabar to the side of the adjacent second metal layer M2 line (farthest right in FIG. 3A). As shown in FIG. 3B, other length-to-width multiples, e.g., 1.3, etc., are also possible. Further as also shown in FIG. 3B, viabar 102 may have a width that is less than other vias 14. Although not shown, viabar 102 also does not have to be of a rectangular configuration.

In addition to viabar 102, as shown in FIGS. 2, 3A-B and 5, each IC 100 may also include a conventional wrong way metal 12 extending in a direction perpendicular to the second direction within second metal layer M2 and a pair of vias 14 interconnecting wrong way metal 12 to wiring in first metal layer M1.

Each of metal layer M1, M2, M3, via layer V1, V2, viabar 102, vias 14, etc., may be formed using any now known or later developed methods, e.g., Damascene or dual Damascene methods.

Depending on the design details in a local area, the addition of viabar(s) 102 could potentially cause lithography process window concerns for the via level lithography, so viabar(s) 102 should be used in an intelligent/opportunistic and automated manner, through process window analysis. According to another embodiment, a method is provided including providing first metal layer M1 having wiring running in a first direction and second metal layer M2 having wiring running in a second direction perpendicular to the first direction. "Providing" as used may include providing a design structure of IC 100 in the form of schematics or HDL, a hardware-description language (e.g., Verilog, VHDL, C, etc.). The design structure may be contained on one or more machine readable medium. For example, design structure may be a text file or a graphical representation of an embodiment of the disclosure as shown in FIG. 2-3B or 5.

In order to determine whether viabar 102 is advisable, an evaluation may be performed of which structure presents a lowest possibility of degrading yield. That is, which of the following presents the lowest possibility of degrading yield: a) use of a wrong way metal 12 extending in a direction perpendicular to the second direction within second metal layer M2 and a pair of vias 14 interconnecting the wrong way metal to wiring in first metal layer M1, or b) a viabar 102, in first via layer V1 between first metal layer M1 and second metal layer M2, and interconnecting first metal layer M1 to second metal layer M2 at first location 104 where metal layers M1, M2 vertically coincide and, at a second location 106 connecting to wiring of one of the metal layers M1, M2 but not wiring of the other metal layer M2, M1. The decision to place the viabar as in FIGS. 2-3B, instead of placing a wrong way metal 12 and two vias 14 alone, as in FIG. 1, may be the result of running an evaluation (e.g., algorithm) which makes use of lithography process window models for both second metal layer M2 and first via layer V1. The evaluation could compare second metal layer M2 lithography process window reduction through addition of a wrong way metal 12 in second metal layer M2 and extra square via 14, to any potential first via layer V1 lithography process window reduction through addition of viabar 102 instead of wrong way metal 12 and extra square via 14. An evaluation may also take into account the alignment tolerance of second metal layer M2 pattern to the first via layer V1 pattern insofar as severe misalignment of the two patterns will increase the propensity for shorting (the algorithm decides whether to place the wrong way metal or the viabar to achieve the desired more robust connection, based on which method is expected to cause the least chance of degrading yield).

In terms of the FIG. 6 embodiment, the decision to place viabar 102 may be the result of running an evaluation (e.g., algorithm) which makes use of lithography process window models for both first metal layer M1 and first via layer V1. The algorithm may compare first metal layer M1 lithography process window reduction through addition of the first metal layer M1 wrong way metal 12 and extra regular via 14, to any potential first via layer V1 lithography process window reduction through addition of viabar 102 instead of the wrong way metal and extra regular via. In this case, the evaluation may also take into account the alignment tolerance of the first metal layer M1 pattern to the first via layer V1 pattern (and the pattern of contacts below the M1 pattern) insofar as severe misalignment of the patterns will increase the propensity for shorting (the evaluation decides whether to place wrong way metal 12 or viabar 102, to achieve the desired more robust connection, based on which method is expected to cause the least chance of degrading yield). In any event, the above-described evaluations may be performed for as many wrong way metal 12 opportunities as exist within a design structure of IC 100. The above-described evaluations may be performed using any now known or later developed IC design analysis computer system, the implementation of which is readily within the purview of one with skill in the art.

Finally, the structure that presents a lowest possibility of degrading yield is implemented, e.g., added to the design structure and/or built.

The methods and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) comprising:
   a first metal layer having wiring running in a first direction;
   a second metal layer having wiring running in a second direction perpendicular to the first direction; and
   a first via layer between the first metal layer and the second metal layer, the first via layer comprising a single viabar interconnecting the first metal layer to the second metal layer at a first location where the first metal layer vertically coincides with the second metal layer and, at a second location, connecting to wiring of the first metal layer but not wiring of the second metal layer,
   wherein the first via layer is a distinct layer from each of the first metal layer and the second metal layer, and wherein at least a portion of the first via layer extends to a height equal to a height of the second metal layer.

2. The IC of claim 1, wherein the viabar has a length that is a multiple greater than 1.0 of a width thereof.

3. The IC of claim 2, wherein the width is not identical to a width of another via in the via layer.

4. The IC of claim 1, wherein the viabar has a length three times a width thereof.

5. The IC of claim 1, wherein the viabar has a width that is substantially identical to a width of another via in the via layer.

6. The IC of claim 1, wherein the first metal layer is below the second metal layer.

7. The IC of claim 1, wherein the first metal layer is above the second metal layer.

8. The IC of claim 1, further comprising a wrong way metal extending in a direction perpendicular to the second direction within the second metal layer and a pair of vias interconnecting the wrong way metal to wiring in the first metal layer.

9. The IC of claim 1, wherein the first via layer contacts the wiring of the second metal layer on two distinct sides of the wiring of the second metal layer.

10. The IC of claim 9, wherein the first via layer contacts the wiring of the first metal layer on only one side of the wiring of the first metal layer.

11. The IC of claim 10, wherein the first via layer contacts the two distinct sides of the wiring of the second metal layer on a first side and a second side, respectively, of the first via layer, and wherein the first via layer contacts the wiring of the first metal layer on a side distinct from the first side and the second side.

12. An integrated circuit (IC) comprising:
a first metal layer having wiring running in a first direction;
a second metal layer having wiring running in a second direction perpendicular to the first direction;
a wrong way metal extending in a direction perpendicular to the second direction within the second metal layer and a pair of vias interconnecting the wrong way metal to wiring in the first metal layer; and
a first via layer between the first metal layer and the second metal layer, the first via layer comprising:
a single viabar interconnecting the first metal layer to the second metal layer at a first location where the first metal layer vertically coincides with the second metal layer and, at a second location, connecting to wiring of the first metal layer but not wiring of the second metal layer,
wherein the viabar has a width that is substantially identical to a width of another via in the via layer, and
wherein the first via layer is a distinct layer from each of the first metal layer and the second metal layer, and
wherein at least a portion of the first via layer extends to a height equal to a height of the second metal layer.

13. The IC of claim 12, wherein the viabar has a length twice a width thereof.

14. The IC of claim 13, wherein the width is substantially identical to a width of another via in the via layer.

15. The IC of claim 12, wherein the viabar has a length three times a width thereof.

16. The IC of claim 12, wherein the first metal layer is below the second metal layer.

17. The IC of claim 12, wherein the first metal layer is above the second metal layer.

* * * * *